(12) United States Patent  
Sakai et al.

(10) Patent No.: US 11,856,827 B2  
(45) Date of Patent: Dec. 26, 2023

(54) DISPLAY DEVICE WITH REDUCED LEAKAGE CURRENT

(71) Applicant: SHARP KABUSHIKI KAISHA, Sakai (JP)

(72) Inventors: Tamotsu Sakai, Sakai (JP); Tetsuya Ueno, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 148 days.

(21) Appl. No.: 17/428,543

(22) PCT Filed: Feb. 8, 2019

(86) PCT No.: PCT/JP2019/004539  
§ 371 (c)(1),  
(2) Date: Aug. 4, 2021

(87) PCT Pub. No.: WO2020/161877  
PCT Pub. Date: Aug. 13, 2020

(65) Prior Publication Data  
US 2022/0181425 A1   Jun. 9, 2022

(51) Int. Cl.  
*H10K 59/131*   (2023.01)

(52) U.S. Cl.  
CPC .................................. *H10K 59/131* (2023.02)

(58) Field of Classification Search  
CPC .. H10K 59/131; H10K 59/179; H01L 27/124; H01L 27/1225; H01L 27/3276; H01L 27/3288; G09F 9/30  
See application file for complete search history.

(56) References Cited

U.S. PATENT DOCUMENTS

| 2018/0102401 A1* | 4/2018 | Kim ................... H10K 59/1213 |
| 2018/0331171 A1 | 11/2018 | Kim et al. |
| 2020/0119130 A1 | 4/2020 | Kim et al. |
| 2020/0403058 A1 | 12/2020 | Kim et al. |

FOREIGN PATENT DOCUMENTS

| JP | H11-231805 A | 8/1999 |
| JP | 2018-189965 A | 11/2018 |

\* cited by examiner

*Primary Examiner* — Suberr L Chi  
*Assistant Examiner* — Carnell Hunter, III  
(74) *Attorney, Agent, or Firm* — ScienBiziP, P.C.

(57) ABSTRACT

A display device includes: a semiconductor layer; a gate insulating film; a first display wire; a first interlayer insulating film; a second display wire; a second interlayer insulating film; and a third display wire stacked on a substrate in this order, pixel circuits being provided corresponding to intersections of data signal lines and scanning signal lines included in the third display wire, each of the pixel circuits including a first transistor and a second transistor in which any one of the scanning signal lines overlaps the semiconductor layer through the gate insulating film, one terminal of the first transistor and one terminal of the second transistor are connected together through a connector included in a conductor region of the semiconductor layer, and the connector includes an overlap connector overlapped in a plan view with the data signal lines through a constant potential wires included in the first display wire.

12 Claims, 13 Drawing Sheets

DISPLAY DEVICE WITH REDUCED LEAKAGE CURRENT

TECHNICAL FIELD

The disclosure relates to a method for producing a display device formed on a substrate, and the display device.

BACKGROUND ART

Recent advancement in organic light-emitting diode (OLED) technologies allows increasing number of products to be provided with organic electroluminescence (EL) display devices. A typical organic EL display device includes a plurality of pixel circuits to supply currents to pixels in a light-emitting layer.

A pixel circuit usually includes a plurality of transistors combined together, and appropriately selects a pixel to emit light in accordance with a signal that the pixel circuit receives. Depending on a layout of the transistors, for example, charges accumulate in a gate electrode, and an intended leakage current flows into a light-emitting element. The leakage current could prevent control of brightness of the pixel. Hence, in a proposed technique, the transistors are of a double-gate structure to reduce the leakage current. (See, for example, Patent Document 1.)

CITATION LIST

Patent Literature

Patent Document 1 Japanese Unexamined Patent Application Publication No. H11-231805

SUMMARY

Technical Problem

A display device described in Patent Document 1 includes two thin-film transistors provided on a substrate. One of the thin-film transistors has a double-gale structure. In the above display device, two transistors are combined together to constitute a pixel circuit. However, the display device fails to include more transistors for precise control. Another problem is that more transistors require more complex wiring for the transistors, and it is difficult to design a layout of such complex wiring to fit in a small region.

The disclosure is intended to overcome the above problems, and to provide a display device to allow the transistors to operate stably.

Solution to Problems

A display device according to the disclosure displays an image by supplying respective data signals to a plurality of pixel circuits arranged in a display panel. The display device includes: a semiconductor layer; a gate insulating film; a first display wire; a first interlayer insulating film; a second display wire; a second interlayer insulating film; and a third display wire stacked on a substrate in a this order. The first display wire including a plurality of scanning signal lines extending in a row direction. The second display wire including a plurality of constant potential wires extending in the row direction. The third display wire including a plurality of data signal lines extending in a column direction and intersecting with the scanning signal lines and the constant potential wires, the column direction intersecting with the row direction. The plurality of pixel circuits being provided corresponding to intersections of the data signal lines and the scanning signal lines. Each of the pixel circuits including a first transistor and a second transistor in which any one of the scanning signal lines overlaps the semiconductor layer through the gate insulating film. One conductive terminal of the first transistor and one conductive terminal of the second transistor are connected together through a connector included in a conductor region of the semiconductor layer. The connector includes an overlap connector overlapped in a plan view with the data signal lines through the constant potential wires.

In the display device according to the disclosure, the one conductive terminal and the other conductive terminal of the first transistor may be arranged in the column direction along the data signal lines. The one conductive terminal and the other conductive terminal of the second transistor may be arranged in the column direction along the data signal lines. The overlap connector may be overlapped with the constant potential wires, and extends in the row direction.

In the display device according to the disclosure, any one of the constant potential wires may be an initialization wire.

In the display device according to the disclosure, the first transistor and the second transistor may serve as an initialization transistor.

In the display device according to the disclosure, each of the pixel circuits may include a drive transistor. The other conductive terminal of the first transistor may be electrically connected to the initialization wire. The other conductive terminal of the second transistor may be electrically connected to a control terminal of the drive transistor.

In the display device according to the disclosure, each of the pixel circuits may include a third transistor in which a branch gate electrode overlaps the semiconductor layer. The branch gate electrode may branch off the scanning signal lines overlapping the first transistor and the second transistor and extending.

In the display device according to the disclosure, the third transistor may have: one conductive terminal connected to the one conductive terminal of the first transistor through the connector; and the other conductive terminal connected to the one conductive terminal of the second transistor through the connector.

In the display device according to the disclosure, the semiconductor layer including the third transistor may be overlapped with the constant potential wires in a plan view.

In the display device according to the disclosure, the data signal lines may pass between the first transistor and the third transistor in the row direction.

In the display device according to the disclosure, the third display wire may include a power-source voltage line. The power-source voltage line may pass between the second transistor and the third transistor in the row direction.

In the display device according to the disclosure, the other conductive terminal of the first transistor may be connected to any one of conductive terminals of an initialization transistor of a neighboring pixel circuit through the conductor region of the semiconductor layer.

In the display device according to the disclosure, the scanning may include a light-emission control line.

Advantageous Effects of Invention

Thanks to the configurations of the disclosure, a constant potential wire is sandwiched between, and intersected (overlapped) with, a data signal line and a conductor region. Such a feature can reduce an effect of the data signal line on the conductor region, and stabilize the operation of the transistors.

DESCRIPTION OF EMBODIMENTS

First Embodiment

Described below is a display device according to a first embodiment disclosure, with reference to the drawings.

Figure 1:
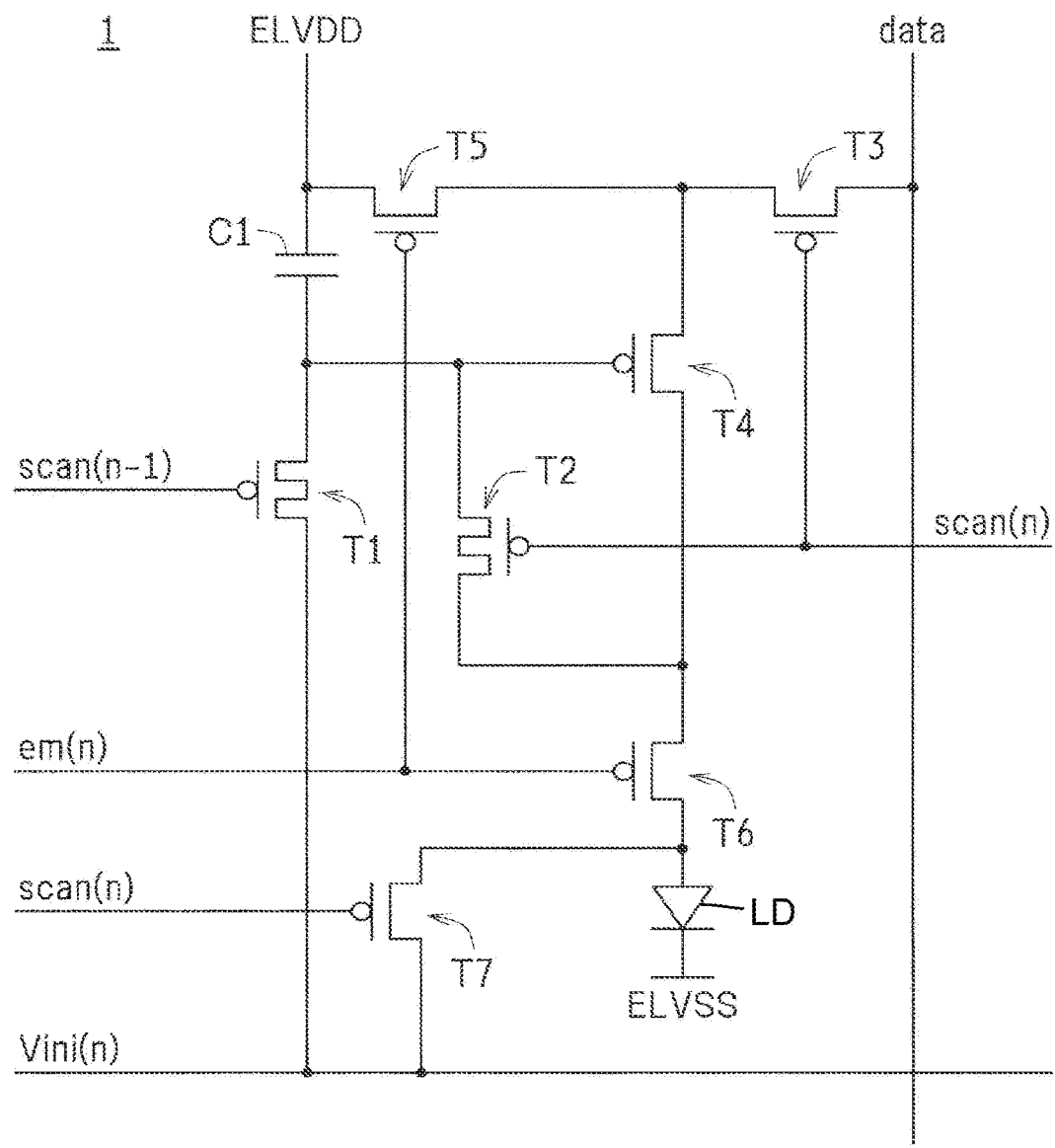
FIG. 1 is an equivalent circuit diagram illustrating a pixel circuit of a display device.

FIG. 1 is an equivalent circuit diagram illustrating a pixel circuit of the display device.

A display device 1 includes a display region in which a plurality of pixels are arranged in a matrix. The pixels typically include red pixels representing red, green pixels representing green, and blue pixels representing blue. Each of the pixels is provided with a corresponding light emitting diode LD, and controlled by a corresponding pixel circuit.

Straight lines corresponding to "Scan(n)" and "Scan(n−1)" indicate scanning signal lines. A straight line corresponding to "data" indicates a data signal line. A straight line corresponding to "em(n)" indicates a light-emission control line. Moreover "ELVDD" indicates a high power-source voltage, and a straight line led to "ELVDD" corresponds to a high power-source voltage line. Furthermore, "ELVSS" indicates a low power-source voltage, and a straight line led to "ELVSS" corresponds to a low power-source voltage line. A straight line corresponding to "Vini(n)" indicates an initialization wire corresponding to a reset potential.

In this embodiment, the high power-source voltage line receives a voltage of 5 V, and the low power-source-voltage line receives a voltage of −5 V. The data signal line receives a voltage ranging from 2 to 6 V. The initialization wire receives a voltage of −4 V. The scanning signal line and the light emission control line receive a voltage of 7 V in a "High" state and a voltage of −8 V in a "Low" state, FIG. 1 illustrates an example of the pixel circuit including a combination of: seven transistors (a first circuit transistor T1 to a seventh circuit transistor T7); a capacitor C1; and a light-emitting diode LD.

In the pixel circuit, the first circuit transistor T1 to the third circuit transistor T3 and the fifth circuit transistor T5 to the seventh circuit transistor T7 are used as switching transistors. Moreover, the fourth circuit transistor T4 serves as a drive transistor to supply power to the light-emitting diode LD.

The first circuit transistor T1, an initialization transistor, has one end connected to a gate electrode of the drive transistor (the fourth circuit transistor T4) and the other end connected to the initialization wire. The seventh circuit transistor T7, an initialization transistor, has one end connected to an anode of the light-emitting diode LD and the other end connected to the initialization wire.

Figure 2:
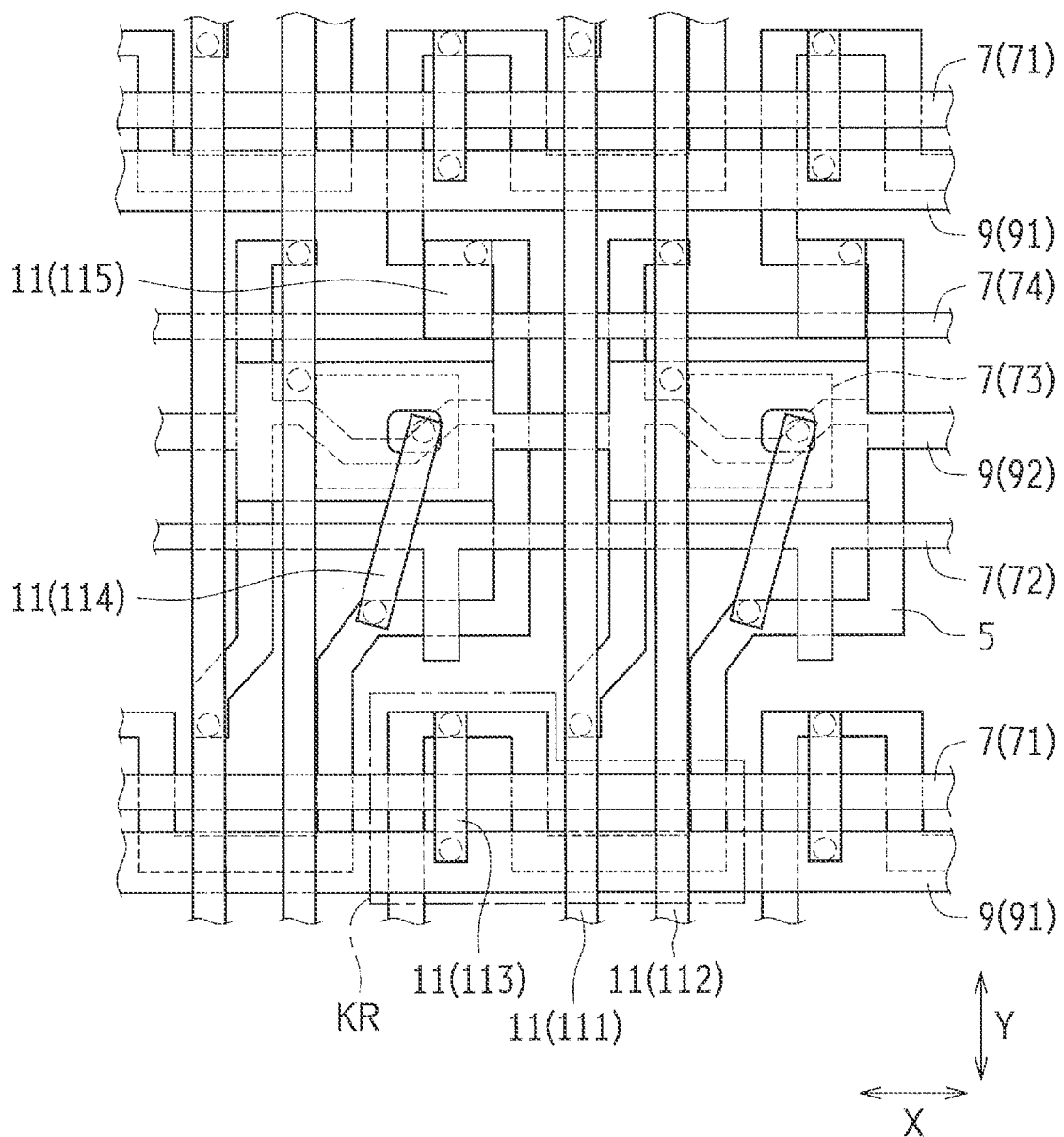
FIG. 2 is a plan view schematically illustrating the pixel circuit of the display device.

FIG. 2 is a plan view schematically illustrating the pixel circuit of the display device. Note that, in FIG. 2, such components as wires are selectively illustrated and such components as an interlayer insulating film are omitted that the drawing is easily viewable.

FIG. 2 schematically shows a layout of the pixel circuit illustrated in FIG. 1 and provided on a substrate 2. FIG. 2 also shows a portion of a neighboring pixel circuit. Hereinafter, for the sake of description, a horizontal direction in a plan view may be referred to as a row direction X and a vertical direction in a plan view may be referred to as a column direction Y. Note that the layout of the pixel circuit is described in detail together with shapes of a semiconductor layer 5, a first display wire 7, a second display wire 9, and a third display wire 11 illustrated in FIGS. 5 to 9.

The second display wire 9 includes an initialization wire 91 described above. Described next is a structure of an intersection region KR in the vicinity of the initialization wire 91, with reference to FIGS. 3 and 4.

Figure 3:
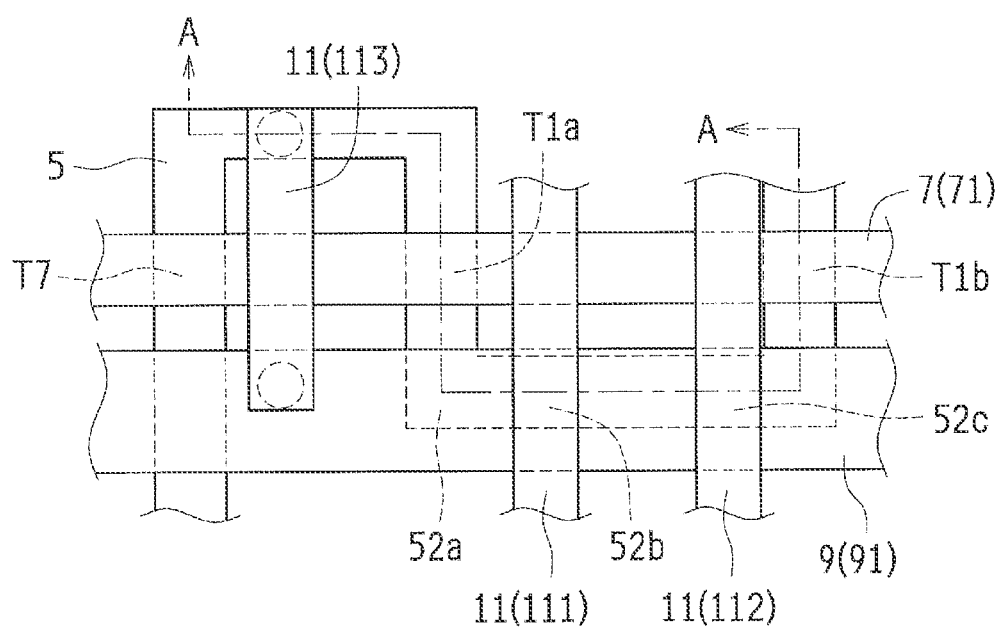
FIG. 3 is a plan view enlarging a vicinity of an intersection region in FIG. 2.
Figure 4:
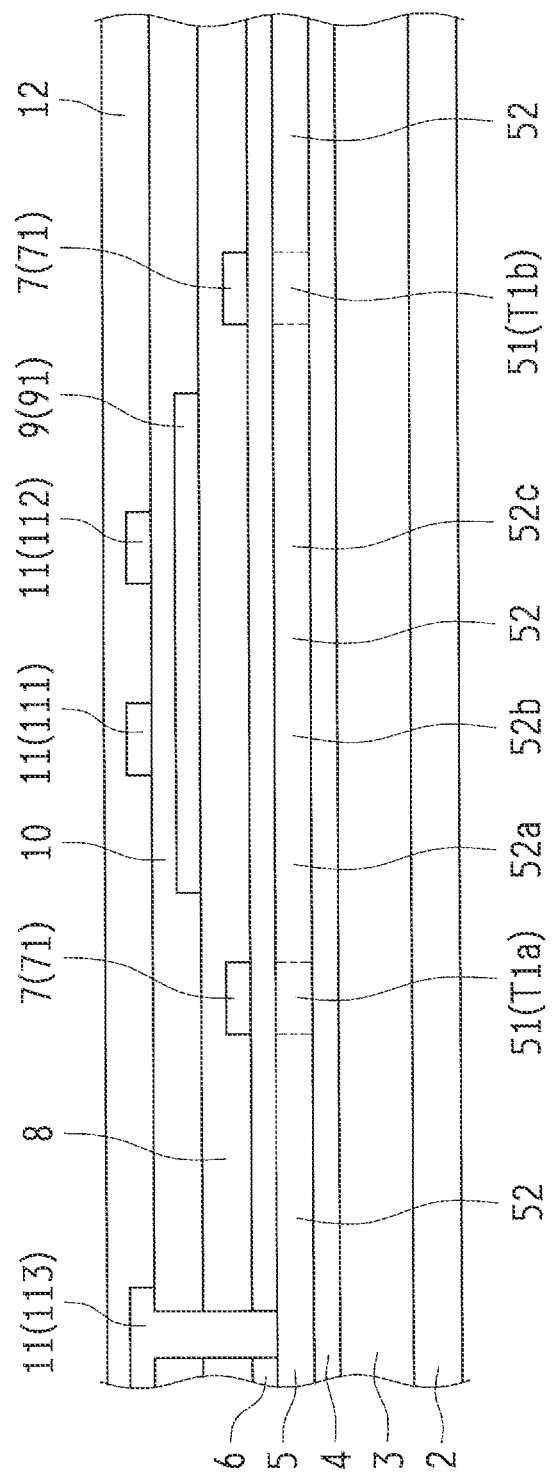
FIG. 4 is a cross-sectional view schematically viewed along arrows A-A in FIG. 3.

FIG. 3 is a plan view enlarging a vicinity of the intersection region in FIG. 2. FIG. 4 is a cross-sectional view schematically viewed along arrows A-A in FIG. 3. Note that FIG. 4 illustrates a developed cross-section along the semiconductor layer 5 bent in a plan view.

The display device 1 includes: a resin layer 3; an underlayer 4; the semiconductor layer 5; a gate insulating film 6; the first display wire 7; a first interlayer insulating film 8; the second display wire 9; a second interlayer insulating film 10; the third display wire 11; and a planarization film 12 stacked on a substrate 2 in this order.

Examples of the substrate 2 may include a glass substrate, a silicon substrate, and a heat-resistant plastic substrate (a resin substrate). Example materials of the plastic substrate (the resin substrate) include polyethylene terephthalate (PET), polyethylene naphthalate (PEN), polyethersulfone (TES), acrylic resin, and polyimide. Note that the substrate 2 has any given thickness, and may be formed into a thin film.

The resin layer 3 may be formed of, for example, polyimide resin (PI).

The underlayer 4 is an inorganic $SiO_2$ film deposited by chemical vapor deposition (CVD). The underlayer 4 is not limited to the $SiO_2$ film. For example, the underlayer 4 may be formed of such materials as silicon oxide ($SiO_x$), silicon nitride ($SiN_x$), silicon oxide nitride ($SiO_xN_y$; x>y), silicon nitride oxide ($SiN_xO_y$; x>y), aluminum oxide, and tantalum oxide. The underlayer 4 may be a multilayer including a plurality of layers stacked on top of each other.

The semiconductor layer 5 is low-temperature polycrystalline silicon (LTPS) formed by such a known technique as the CVD.

The semiconductor laxer 5 may be formed not only of the above material but also a another material. The oxide semiconductor contained in the semiconductor layer 5 may be, for example, an amorphous oxide semiconductor (a non-crystalline oxide semiconductor) and a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axes are oriented substantially perpendicularly to the planes of the layers.

Moreover, the semiconductor layer 5 may be of a multilayer structure including two or more layers. In this case, the semiconductor layer 5 may include a non-crystalline oxide semiconductor layer and a crystalline oxide semiconductor layer. Alternatively, the semiconductor layer 5 may include a plurality of crystalline oxide semiconductor layers having different crystal structures and a plurality of non-crystalline oxide semiconductor layers.

Described next in detail are materials and structures of the non-crystalline oxide semiconductor and the crystalline oxide semiconductor. The semiconductor layer 5 may contain at least one metal element from among, for example, In, Ga, and Zn. Here, the In—Ga—Zn—O-based semiconductor is a ternary oxide of In (indium), Ga (gallium), and Zn (zinc). Proportions of In, Ga, and Zn may be any given ones. For example, the proportions may include In:Ga:Zn=2:2:1, In:Ga:Ln=1:1:1, and In:Ga:Zn=1:1:2. Moreover, the In—Ga—Zn—O-based semiconductor may be amorphous or crystalline. Preferably, the crystalline In—Ga—Zn—O-based semiconductor has the c-axes oriented substantially perpendicularly to the planes of the layers.

Instead of the In—Ga—Zn—O-based semiconductor, the oxide semiconductor layer 5 may contain another oxide semiconductor such as, far example, an In—Sn—Zn—O-based semiconductor. The In—Sn—Zn—O-based semiconductor is a ternary oxide of In, Sn (tin), and Zn. An example of the In—Sn—Zn—O-based semiconductor includes $In_2O_3$—$SnO_2$—$ZnO(InSnZnO)$.

The semiconductor layer 5 shall not, be limited to the above ones. Alternatively, the semiconductor layer 5 may contain such substances as: an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor an In—Ga—Zn—Sn—O-based semiconductor, $InGaO_3(ZnO)_5$, magnesium zinc oxide ($Mg_xZn_{1-x}O$), and cadmium zinc oxide ($Cd_xZn_{1-x}O$). The Zn—O-based semiconductor may be non-crystalline (amorphous) ZnO, polycrystalline ZnO, or microcrystalline ZnO including non-crystalline and polycrystalline ZnO mixed together, all of which additionally contain one kind, or two or more kinds, of impurity elements from among group 1 elements, group 13 elements, group 14 elements, group 15 elements, and group 17 elements. The Zn—O-based semiconductor may also be free of impurity elements.

The gate insulating film 6 is formed of silicon oxide ($SiO_x$) deposited by the CVD. The gate insulating film 6 may be formed of the same material as the underlayer 4 is, and may be formed in a multilayer structure in which a plurality of layers are stacked on top of each other.

The first display wire 7, functioning as a gate electrode of a transistor, is a monolayer film formed of Mo and deposited by sputtering. The first display wire 7 shall not be limited to such a monolayer film. Alternatively, the first display wire 7 may be a metal film containing an element selected from among, for example, aluminum (Al), tungsten (W), molybdenum (Mo), tantalum (Ta), chromium (Cr), titanium (Ti), and copper (Cu), or an alloy film containing these elements as ingredients. The first display wire 7 may further be a multilayer film containing a plurality of films formed of two or more of these elements.

The first interlayer insulating film 8, the second interlayer insulating film 10, and the planarization film 12 are formed of the same material, and by the same method, as the underlayer 4 is. Moreover, the second display wire 9 and the third display wire 11 are formed of the same material, and by the same method, as the first display wire 7 is. Note that, further formed on the planarization film 12 may be a light-emitting element and a contact hole for electrical connection.

The semiconductor layer 5, the first display wire 7, the second display wire 9, and the third display wire 11 may appropriately be patterned in a known photolithography process. Moreover, the contact hole may be provided to, for example, the interlayer insulating films to appropriately connect these different layers.

After the first display wire 7 is formed, the semiconductor layer 5 is treated with plasma and reduced in resistance. Of the semiconductor layer 5, a portion not covered with the first display wire 7 alone is reduced in resistance. A semiconductor region 51 directly below the first display wire 7 is not reduced in resistance; whereas, a conductor region 52 exposed is reduced in resistance. That is, in the semiconductor layer 5, the semiconductor region 51 directly below the first display wire 7 functions as a channel region of a transistor, and the conductor region 52 adjacent to the semiconductor region 51 functions as a source region a drain region (a conductive terminal of the transistor. Moreover, the first display wire 7 has a portion across the gate insulating film 6 from the semiconductor region 51. The portion functions as a gate electrode (a control terminal) of the transistor.

Described next is a shape of each layer in a plan view, with reference to FIGS. 5 to 9. Note that a first contact hole H1 to an eighth contact hole H8 illustrated in FIGS. 5 to 9 show positional relationships with layers corresponding to respective contact holes. Layers not corresponding to the contact holes are partially omitted.

Figure 5:
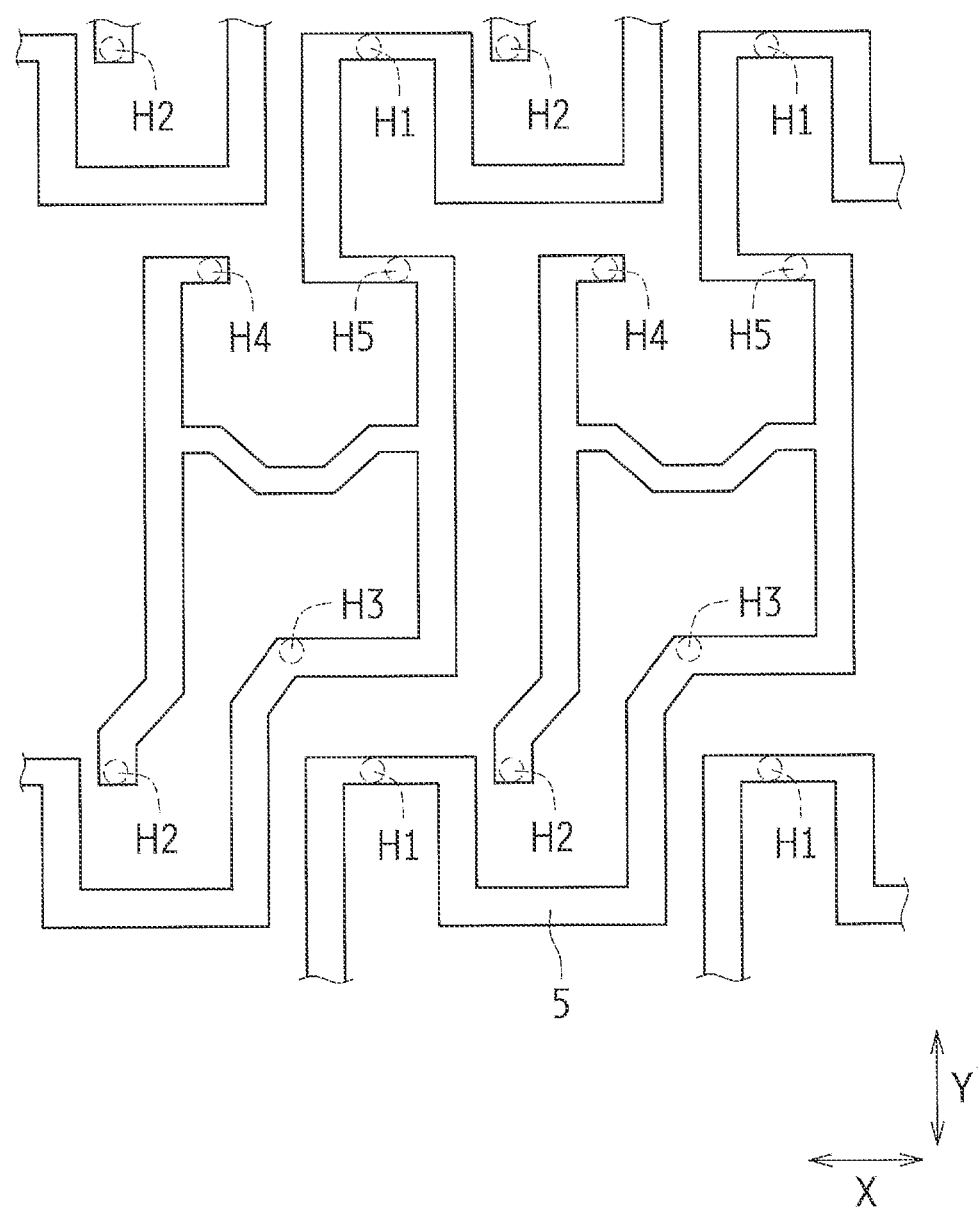
FIG. 5 is a plan view schematically illustrating a layout of a semiconductor layer.

FIG. 5 is a plan view schematically illustrating a layout of a semiconductor layer.

The semiconductor layer 5, which is in a bent shape in a plan view, extends throughout the portions of the pixel circuit. As to be described later, the semiconductor layer 5 is disposed so that the first display wire 7, the second display wire 9, and the third display wire 11, all of which are extended linearly, overlap the semiconductor layer 5 in each position inside the pixel circuit. Moreover the semiconductor layer 5 extends out of the pixel circuit, and connects to the semiconductor layer 5 of a neighboring pixel circuit.

Figure 6:
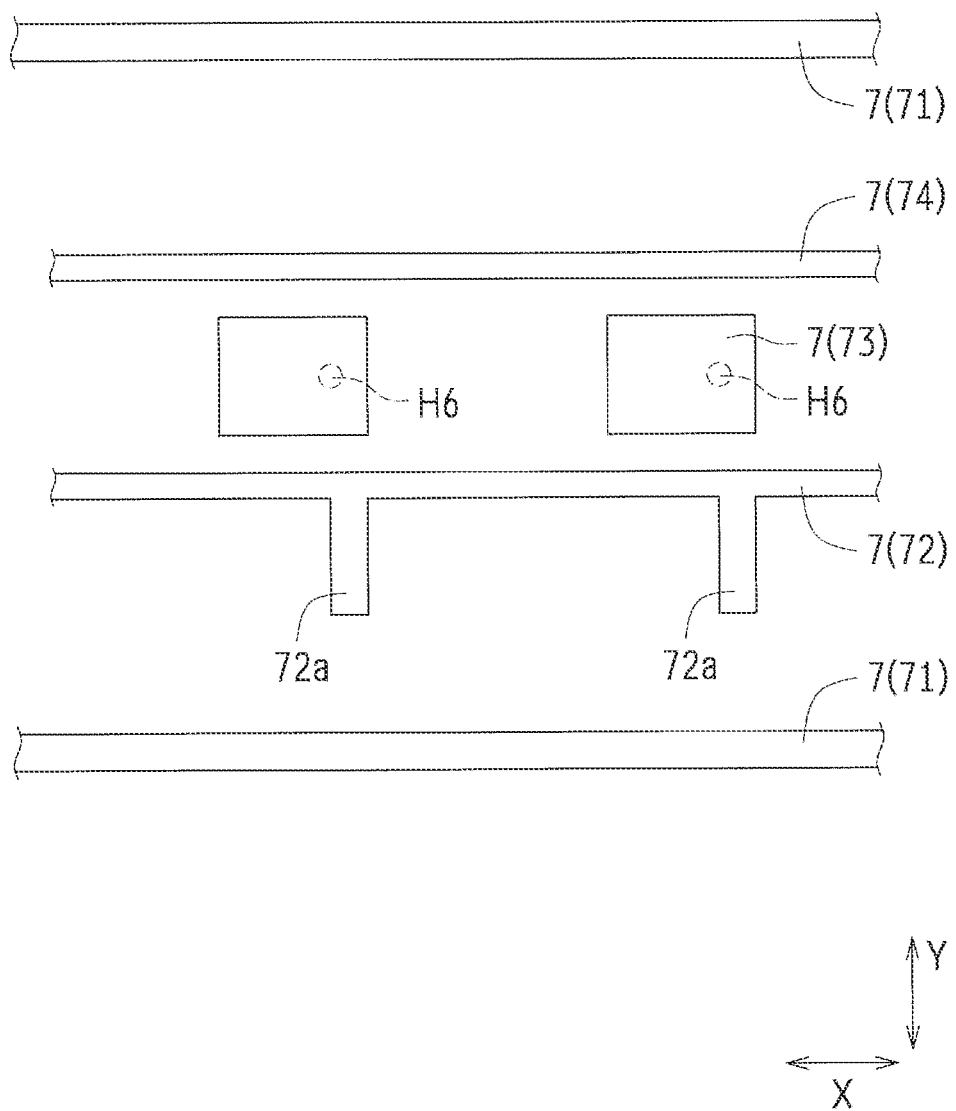
FIG. 6 is a plan view schematically illustrating a layout of a first display wire.

FIG. 6 is a plan view schematically illustrating a layout of the first display wire.

The first display wire 7 includes a plurality of scanning signal lines extending in the row direction X. Specifically, the first display wire 7 includes: a first scanning signal line 71; a second scanning signal line 72; a drive gate 73; and a light-emission control line 74, in FIG. 6, with reference to the first scanning signal line 71 positioned at the lowest, the first scanning signal line 71, the second scanning signal line 72, the drive gate 73, and the light-emission control line 74 are arranged from below upward. Provided above the light-emission control line 74 is another first scanning signal line 71, and these lines are repeatedly arranged in the stated order. One pixel circuit includes one each of the first scanning signal line 71, the second scanning signal line 72, the drive gate 73, and the light-emission control line 74. Moreover, the first scanning signal line 71, the second scanning signal line 72, and the light-emission control line 74 are respectively connected to another scanning signal line 71, another second scanning signal line 72, and another light emission control line 74 of another pixel circuit adjacent thereto in the row direction X.

The scanning signal line 71, shaped linearly, passes through the above intersection region KR. The scanning signal line 72, shaped substantially linearly, includes a branch extension 72a branching off and extending in the column direction Y. The drive gate 73 is shaped into a rectangular. Note that, the shape of the drive gate 73 shall not be limited to a rectangular, and may be changed into an appropriate shape, depending on a shape of the semiconductor layer 5 that the drive gate 73 overlaps. The light-emission control line 74 is shaped linearly.

Figure 7:
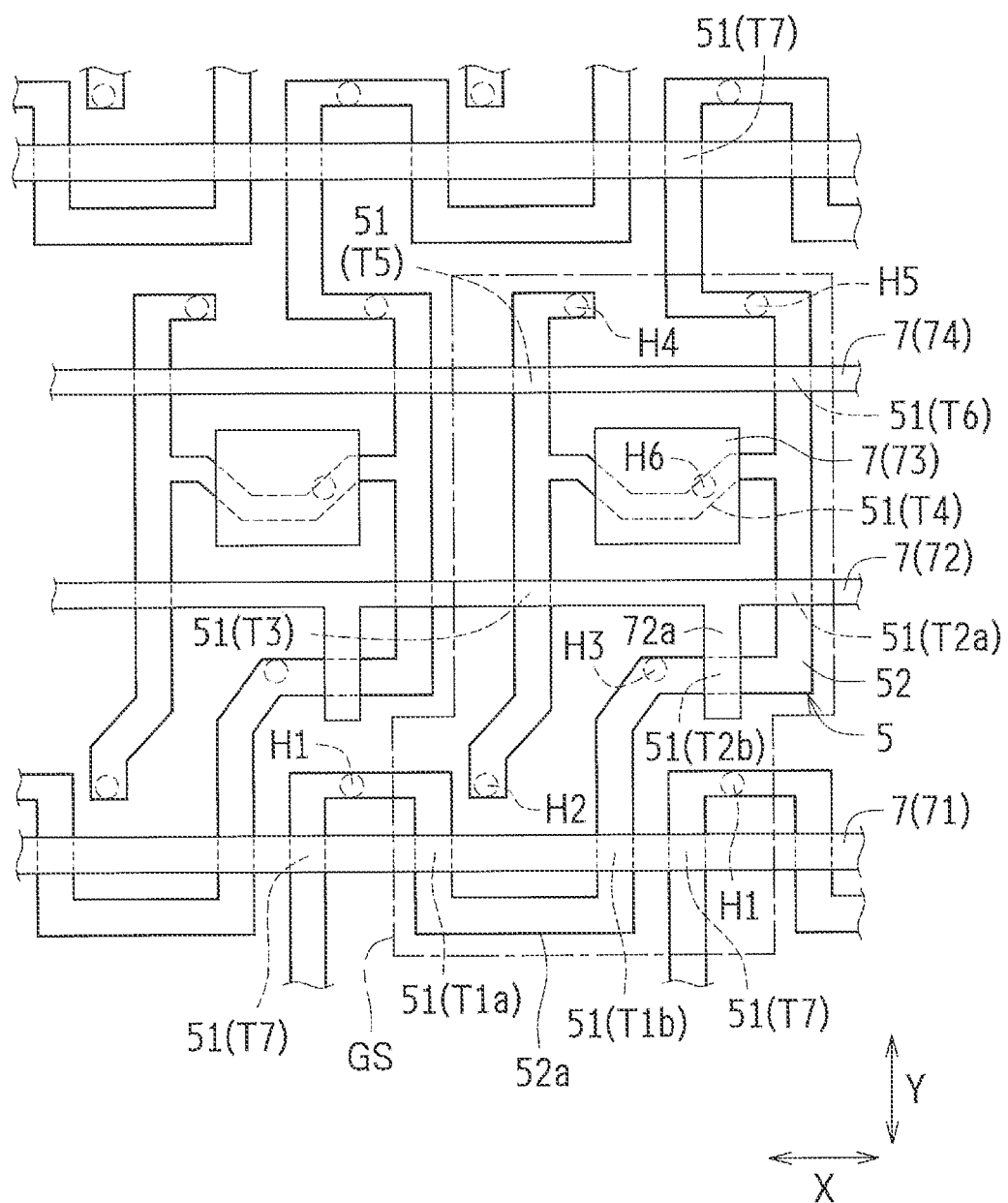
FIG. 7 is a plan view schematically illustrating a layout of the semiconductor layer and the first display wire overlapping each other.

FIG. 7 is a plan view schematically illustrating a layout of the semiconductor layer and the first display wire overlapping each other.

The semiconductor layer 5 is divided into the conductor region 52 and the semiconductor region 51, depending on whether the first display wire 7 overlaps the semiconductor layer 5. Note that, in FIG. 7, an area surrounded with a dot-and-dash line corresponds to one pixel circuit GS. The first scanning signal line 71 and the semiconductor layer 5 share three overlapping portions in one pixel circuit GS. Specifically, the semiconductor layer 5 in the intersection region KR has a portion extending in the row direction X and a portion extending in the column direction Y combined together and shaped into a substantial S-shape, and intersects with the first scanning signal line 71 extending in the row direction X at three points spaced apart from each other in the row direction X.

Among the three points of the conductor region 52, two points (a first transistor T1a and a second transistor T1b) correspond to the first circuit transistor T1 and one point corresponds to the seventh circuit transistor T7. The first circuit transistor T1, a combination of the first transistor T1a and the second transistor T1b connected together in the conductor region 52, is a doubt gate transistor. For the sake of description, the conductor region 52 connecting the first transistor T1a and the second transistor T1b together may also be referred to as a connector 52a. Moreover, the first transistor T1a and the seventh circuit transistor T7 of the pixel circuit OS adjacent to the first transistor T1a in the row direction X are connected together with the conductor region 52 overlapping the first contact hole H1.

Within one pixel circuit GS, the second scanning signal line 72 has two linearly portions and the branch extension. 72a overlapping the semiconductor layer 5. Of the two linearly portions of the second scanning signal line 72 that overlap the semiconductor layer 5, one portion (lower left of the drive gate 73 in FIG. 7) corresponds to the third circuit transistor T3 and the other portion (lower right of the drive gate 73 in FIG. 7) corresponds to the second circuit transistor T2 (a linearly overlapping portion T2a). Moreover, a portion, of the second scanning signal line 72, overlapping the semiconductor layer 5 at the branch extension 72a also corresponds to the second circuit transistor T2 (a branching overlapping portion T2b). The linearly of portion T2a and the branching overlapping portion T2b are connected together with the conductor region 52. Similar to the first circuit transistor T1, the second circuit transistor T2, a combination of the linearly overlapping portion T2a and the branching overlapping portion T2b, is a double-gate transistor. The second transistor T1b and the branching overlapping portion T2b are connected together with the conductor region 52 overlapping the third contact hole H3. The conductor region 52 extending from the third circuit transistor T3 (extending downwards in FIG. 7) has a tip overlapping the second contact hole H2.

The drive gate 73 has one portion overlapping the semiconductor layer 5 within one pixel circuit GS, and corresponds to the fourth circuit transistor T4. The drive gate 73 overlaps the sixth contact hole H6.

The light-emission control line 74 has two poi ions overlapping the semiconductor layer 5 within one pixel circuit and each corresponding to one of the fifth circuit transistor T5 (upper left of the drive gate 73 in FIG. 7) and the sixth circuit transistor T6 (upper right of the drive gate 73 in FIG. 7). The conductor region 52 extending from the fifth circuit transistor T5 (extending upwards in FIG. 7) has a tip overlapping the fourth contact hole H4. The conductor region 52 extending from the sixth circuit transistor T6 (extending upwards in FIG. 7) is positioned in an upper portion of FIG. 7, and connected to the seventh circuit transistor T7 of the pixel circuit GS adjacent to the conductor region 52 in the column direction Y. The conductor region 52 overlaps the fifth contact hole H5.

The conductor region 52 extends from the fourth circuit transistor T4 in one direction (to the left in FIG. 7), and branches oft in two. Each of the branches is connected to one of the third circuit transistor T3 and the fifth circuit transistor T5. Moreover, the conductor region 52 extends from the fourth circuit transistor T4 in the other direction (to the OA in FIG. 7), and branches off in two. Each of the branches is connected to one of the second circuit transistor T2 (the linearly overlapping portion T2a) and the sixth circuit transistor T6.

Figure 8:
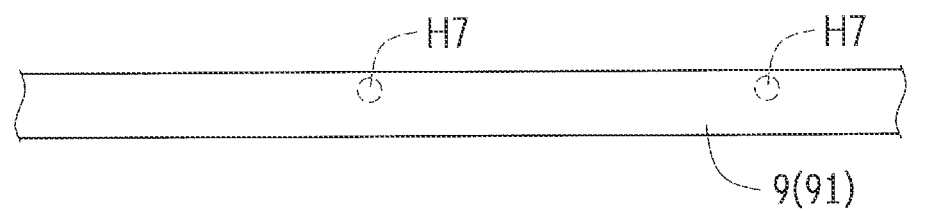
FIG. 8 is a plan view schematically illustrating a layout of a second display wire.
Figure 8:
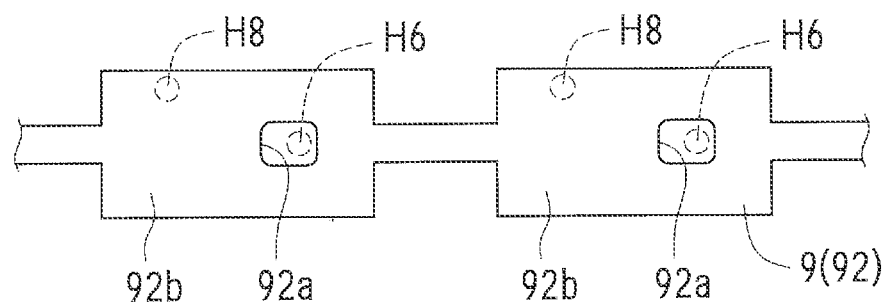
Figure 8:
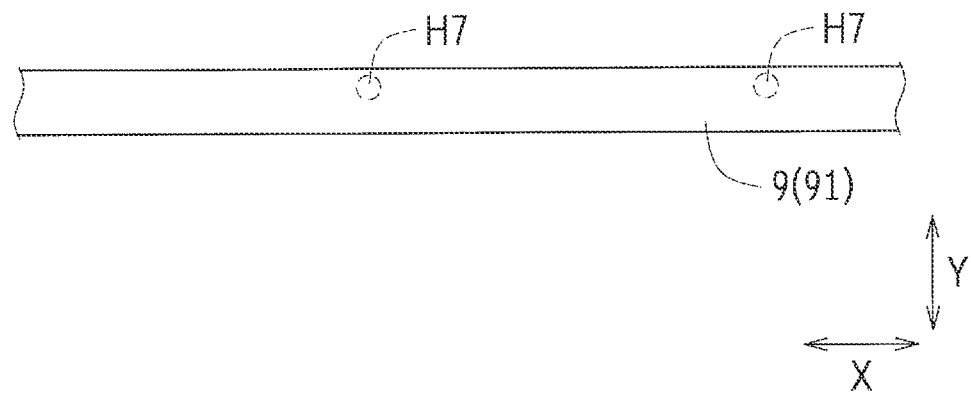

FIG. 8 is a plan view schematically illustrating a layout of the second display wire.

The second display wire 9 includes a constant potential wire extending in the row direction X. Specifically, the second display wire 9 includes: the initialization wire 91; and a first high power source voltage line 92. In FIG. 8, with reference to the initialization wire 91 positioned at the lowest, the initialization wire 91 and the first high power-source voltage line 92 are arranged from below upward. That is, the initialization wire 91 and the first high power-source voltage line 92 are alternately arranged. One pixel circuit includes one each of the initialization wire 91 and the first high power-source voltage line 92. Moreover, the initialization wire 91 and the first high power-source voltage line 92 are respectively connected to another initialization wire 91 and another first high power-source voltage line 92 of another pixel circuit adjacent thereto in the row direction X.

The initialization wire 91, shaped linearly, passes through the above intersection region KR. The initialization wire 91 and the first scanning signal line 71 are arranged in the column Y direction. The initialization wire 91 overlaps the seventh contact hole H7 in the vicinity of the first contact hole H1.

The first high power-source voltage line 92 is shaped into a substantially linear shape whose width is partially great, and positioned to overlap the drive gate 73 described above. Specifically, the first high power-source voltage line 92 includes a wide portion 92b having a great width. The wide portion 92b is sized to cover substantially all of the drive gate 73. A portion of the wide portion 92b is open as an opening 92a in the opening 92a, the first display wire 7 is not covered with the second display wire 9. The opening 92a, is positioned to overlap the sixth contact hole H6. Embedded in the sixth contact hole H6 is the third display wire 11. Through the sixth contact hole H6, the first display wire 7 and the third display wire 11 are connected together. The wide portion. 92b overlaps the eighth contact hole IN in the vicinity of the fourth contact hole H4.

Figure 9:
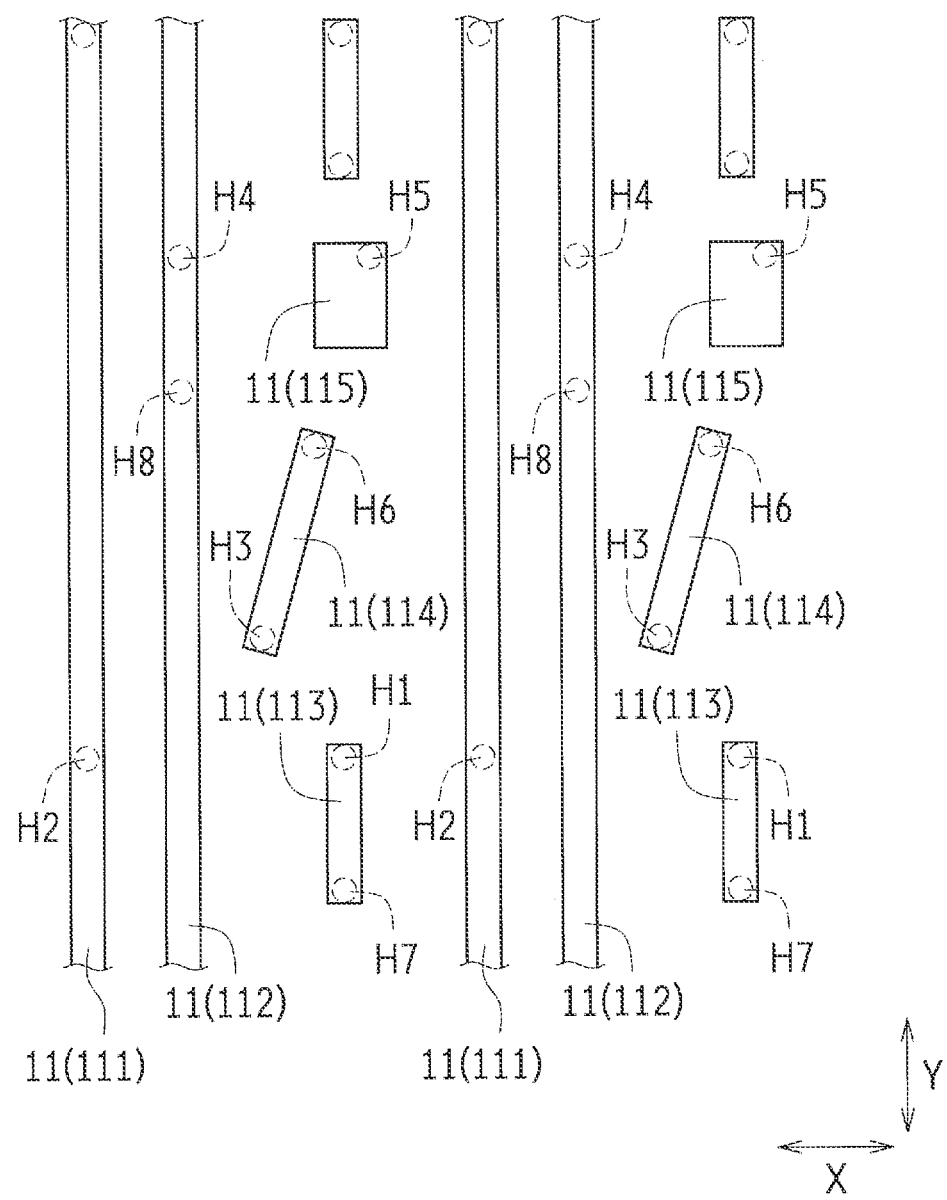
FIG. 9 is a plan view schematically illustrating a layout of a third display wire.

FIG. 9 is a plan view schematically illustrating a layout of the third display wire.

The third display wire 11 includes a data signal line 111 extending in the columns direction Y. Specifically, the third display wire 11 includes: the data signal line 111; a second high power-source voltage line 112; and a contact connector (an initialization connector 113, a drive connector 114, and a light-emission connector 115).

In FIG. 9, with reference to the data signal line 111 positioned at the leftmost, the data signal line 111, the second high power source voltage line 112, and the contact connector are arranged in the stated order from left to right. Provided to the right of the contact connector is another data signal line 111, and these lines are repeatedly arranged in the stated order. One pixel circuit includes one each of the data signal line 111, the second high power-source voltage line 112, and the contact connector. Moreover, in the contact connector, the initialization connector 113, the drive connector 114, and the light-emission connector 115 are spaced apart from each other in the column direction Y.

The data signal line 111, shaped linearly, passes through the above intersection region KR. The data signal line 111 is positioned to pass through the second contact hole H2 and the connector 52a. For the sake of description, a portion, of the connector 52a, overlapped with the data signal line 111 may also be referred to as an overlap connector 52b. In a plan view, this overlap connector 52b is overlapped with the initialization wire 91. Furthermore, the initialization wire 91 preferably overlaps and covers all of the overlap connector 52b including an end of the overlap connector 52b. That is, all of the overlap connector 52b and its end, included in the connector 52a and overlapped with the data signal line 111 in a plan view, are preferably overlapped with the constant potential wire (the initialization wire 91) in a plan view.

The second high power-source voltage line 112, shaped linearly, passes through the above intersection region KR. The second high power-source voltage line 112 is positioned to pass through the fourth contact hole H4, the eighth contact hole H8, and the connector 52a.

The initialization connector 113 is provided to connect the first contact hole H1 to the seventh contact hole H7. That is, through the initialization connector 113, the conductor region 52 in the vicinity of the first transistor T1a and the initialization wire 91 are electrically connected together. The drive connector 114 is provided to connect the third contact hole H3 to the sixth contact hole H6. That is, through the drive connector 114, the conductor region 52 in the vicinity of the second transistor 115 and the drive gate 73 are electrically connected together, the light-emission connector 115 is positioned to overlap the fifth contact hole H5, and electrically connected to the above light-emitting diode LD.

Described next in detail, together with the above features, is a structure of the vicinity of the intersection region KR illustrated in FIGS. 3 and 4.

Of the first transistor T1a, one conductive terminal (the conductor region 52 below the first transistor T1a in FIG. 3) and the other conductive terminals (the conductor region 52 above the first transistor T1a in FIG. 3) are arranged in the column direction Y along the data signal line 111. Of the second transistor T1b, one conductive terminal (the conductor region 52 below the second transistor T1b in FIG. 3) and the other conductive terminal (the conductor region 52 above the second transistor T1b in FIG. 3) are arranged in the column direction along the data signal line 111. The connector 52a is overlapped with the constant potential wire (the initialization wire 91), and extends in the row direction X. One of the conductive terminals of the first transistor T1a and one of the conductive terminals of the second transistor T1b are connected together through the connector 52a.

The data, signal line 111, passing between the first transistor T1a and the second transistor T1b, has a portion overlapping the overlap connector 52b in a plan view and intersecting with the initialization wire 91.

As illustrated in FIG. 4, the constant potential wire (the initialization wire 91) is sandwiched between, and intersected (overlapped) with, the data signal line 111 and the conductor region 52 (the overlap connector 52b). Such a feature can reduce an effect of the data signal line 111 on the conductor region 52, and stabilize the operation of the transistors. That is, when the data signal line 111 and the conductor region 52 overlap, parasitic capacitance therebetween could affect operations of the transistors. However, when the constant potential wire receiving a certain potential is sandwiched between the data signal line 111 and the conductor region 52, variation in the potential can be reduced.

The scanning signal line overlapping the first transistor T1a and the scanning signal line overlapping the second transistor T1b are the same first scanning signal line 71, and receive the same signal. Hence, the first transistor T1a and the second transistor T1b continuously provided are driven by the same signal, allowing the first transistor T1a and the second transistor T1b to function as a dual-gate transistor.

In the above features, the data signal line 111, kept from overlapping the first transistor T1a and the second transistor T1b, can intersect with the overlap connector 52b covered with the initialization wire 91. That is, the features relax restrictions on arrangements of the semiconductor layer 5 with respect to the data signal line 111, allowing for a freer layout of the display device 1. Furthermore, the initialization wire 91 is provided to reset potentials of the transistors, allowing the transistors to carry out various operations.

Note that, similar to the data signal line 111, the second high power-source voltage line 112 includes a wire overlap portion 52c overlapping the connector 52a. The wire overlap portion 52c may be overlapped with the initialization wire 91. Moreover, the initialization wire 91 preferably overlaps and covers all of the wire overlap portion 52c including an end of the wire overlap portion 52c. That is, all of the wire overlap portion 52c and its end included in the connector 52a are preferably overlapped with the constant potential wire (the initialization wire 91) in a plan view. Such a feature makes it possible reduce an effect of parasitic capacitance with the second high power-source voltage line 112.

Second Embodiment

Described next is a display device according to a second embodiment of the disclosure, with reference to the drawings. Note that identical reference signs are used to denote substantially identical constituent features between the first and second embodiments. Such constituent features will not be elaborated upon.

Figure 10:
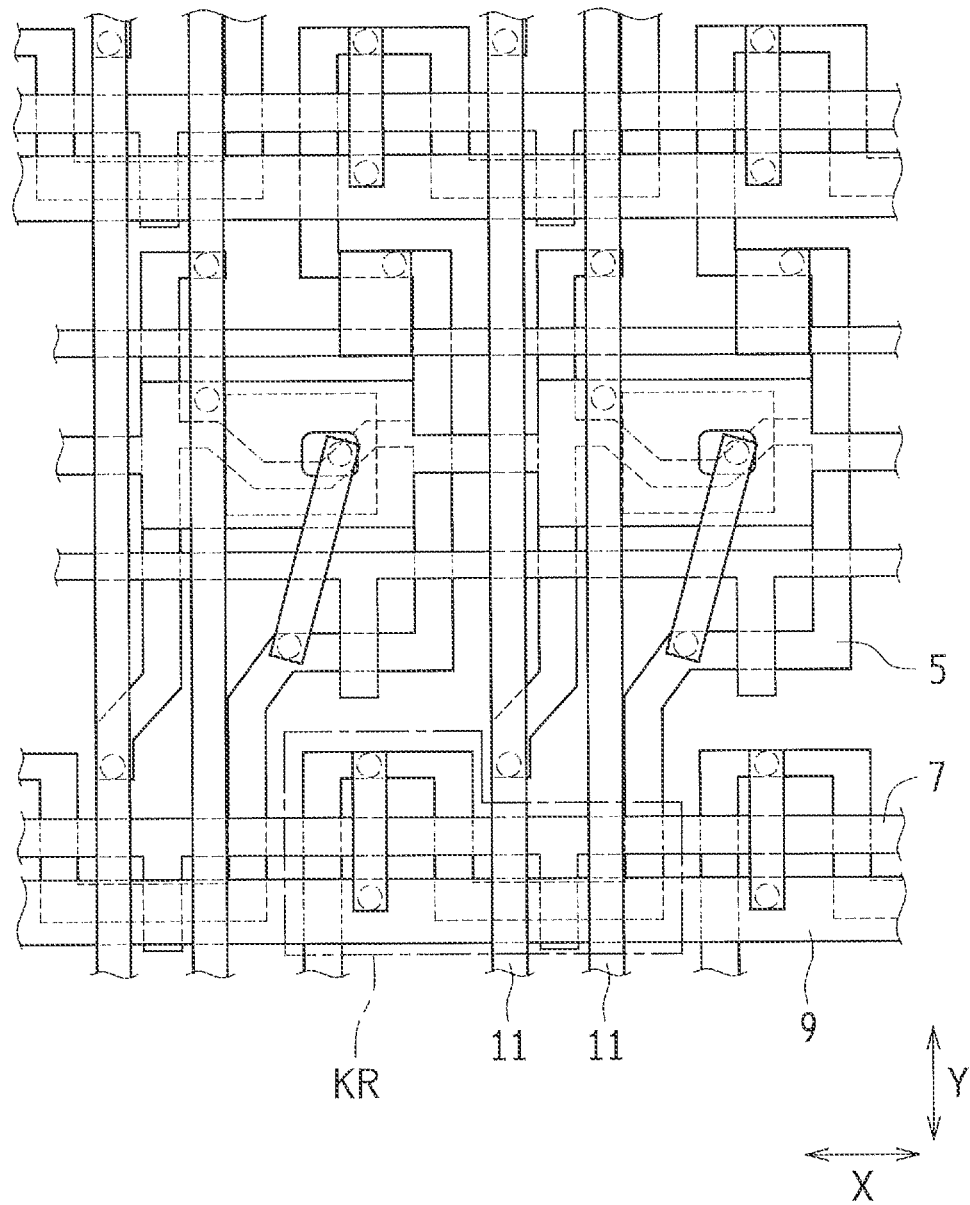
FIG. 10 is a plan view schematically illustrating a pixel circuit of a display device according to a second embodiment of the disclosure.
Figure 11:
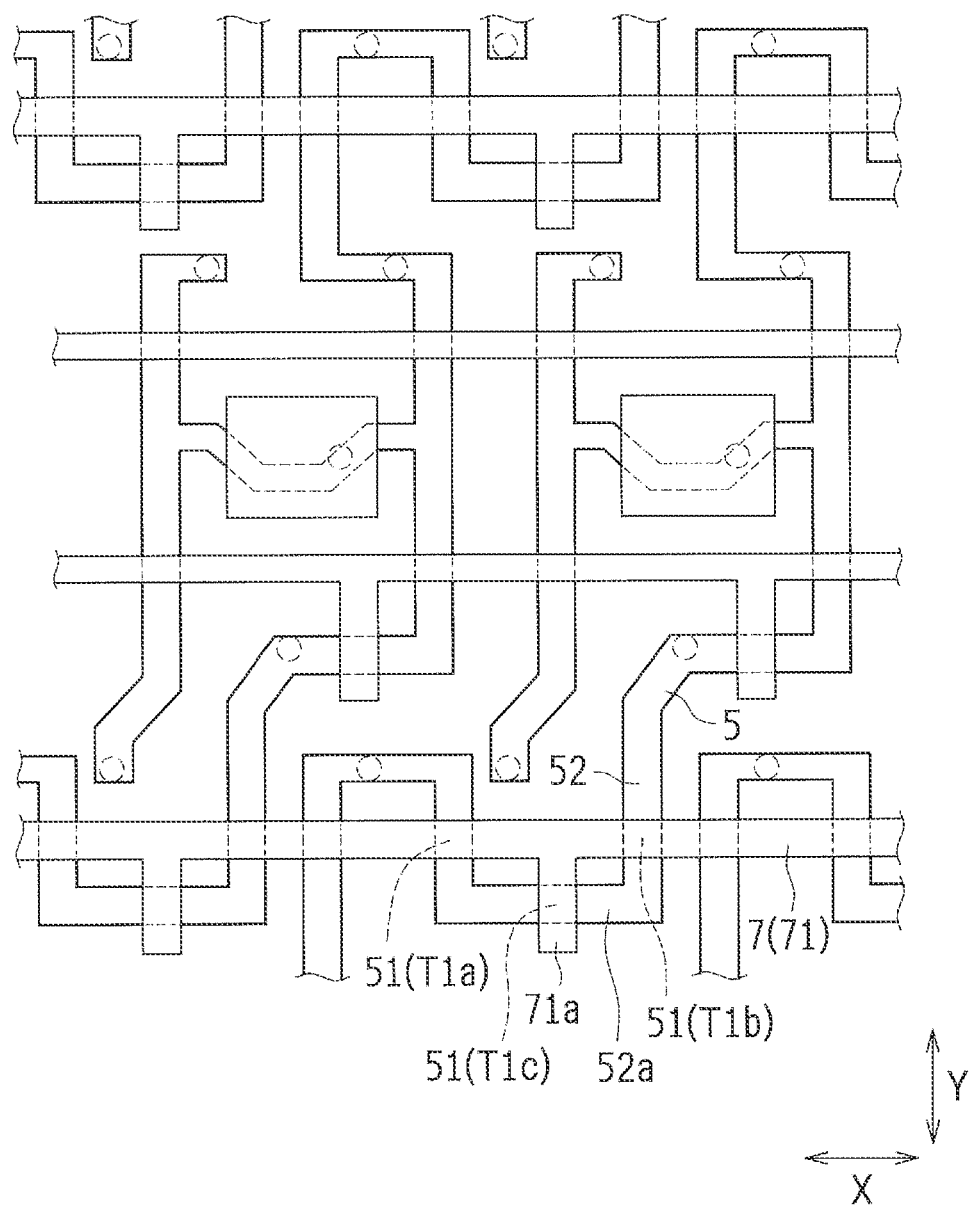
FIG. 11 is a plan view schematically illustrating a layout of the semiconductor layer and the first display wire overlapping each other in the display device according to the second embodiment of the disclosure.
Figure 12:
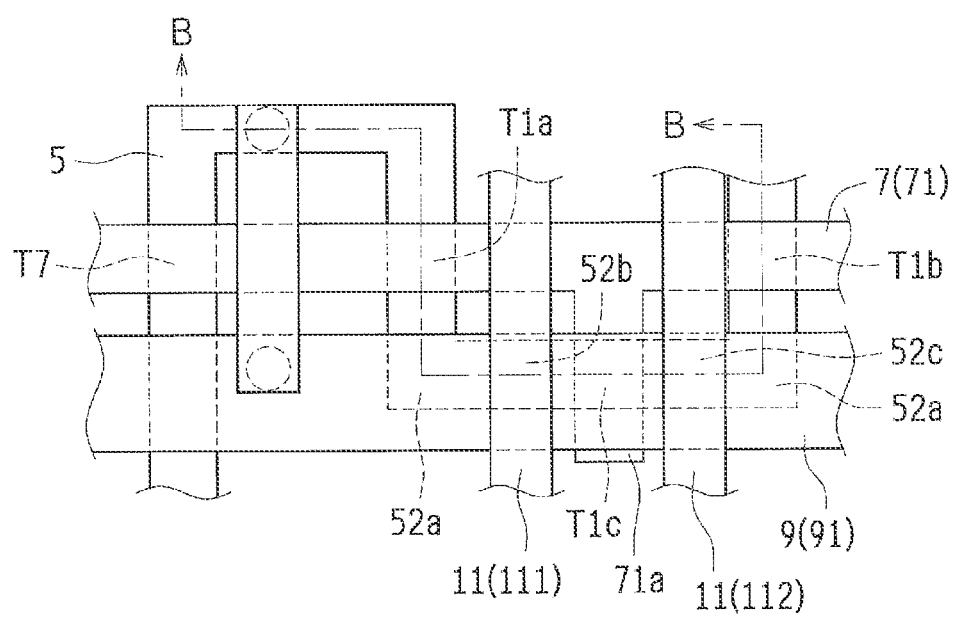
FIG. 12 is a plan view enlarging a vicinity of an intersection region in FIG. 10.
Figure 13:
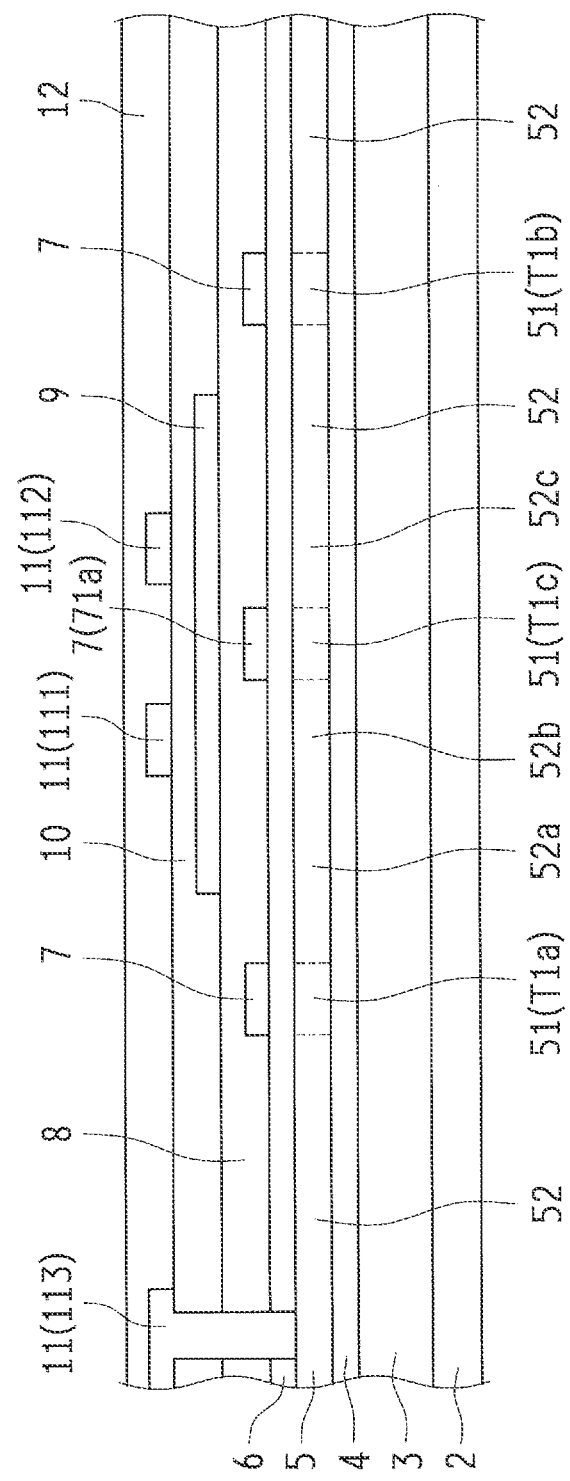
FIG. 13 is a cross-sectional view schematically viewed along arrows B-B in FIG. 12.

FIG. 10 is a plan view schematically illustrating a pixel circuit of the display device according to the second embodiment of the disclosure. FIG. 11 is a plan view schematically illustrating a layout of the semiconductor layer and the first display wire overlapping each other in the display device according to the second embodiment of the disclosure. FIG. 12 is a plan view enlarging a vicinity of an intersection region in FIG. 10. FIG. 13 is a cross-sectional view schematically viewed along arrows B-B in FIG. 12. Note that, in FIGS. 10 and 11, such components as wires are selectively illustrated and such components as an interlayer insulating film are omitted so that the drawings are easily viewable. Moreover, FIG. 13 illustrates a developed cross-section along the semiconductor layer 5 bent in a plan view.

The second embodiment is different in structure of the intersection region KR from the first embodiment. Specifically, as illustrated in FIG. 11, the first scanning signal line 71, included in the first display wire 7 and shaped substantially linearly, includes a branch gate electrode 71a branching off the first scanning signal line 71 and extending in the column direction Y. The branch gate electrode 71a is positioned between the data signal line 111 and the second high power-source voltage line 112 in the row direction X, and overlaps a portion of the semiconductor layer 5. As illustrated in FIG. 13, iii the intersection region KR, the semiconductor layer 5 has a portion overlapped with the branch gate electrode 71a and acting as the semiconductor region 51. The portion functions as a third transistor T1c.

Specifically, the third transistor T1c has: one conductive terminal (the conductor region 52 on the left of the third transistor T1c in FIG. 12) connected to one conductive terminal of the first transistor through the connector 52a (the conductor region 52 below the first transistor T1a in FIG. 12); and the other conductive terminal (the conductor region 52 on the right of the third transistor T1c in FIG. 12) connected to one of the conductive terminals of the second transistor (the conductor region 52 below the second transistor T1b in FIG. 12) through the connector 52a.

The third transistor T1c is provided between, and connected through the conductor region 52 to, the first transistor T1a and the second transistor T1b. The first to third transistors T1a to T1c combined together can function as a single triple-gate transistor. The first transistor T1a the second transistor T1b, and the third transistor T1c correspond to the first circuit transistor T1 of the pixel circuit GS.

The display device 1 according to this embodiment may be any given display panel as long as the display panel includes display elements. Brightness and transmittance of the display elements are controlled either by current or by voltage. Examples of the display elements to be controlled by current include those of: an electroluminescence (EL) display such as an organic EL display including organic light-emitting diodes (OLEDs) and an inorganic EL display including inorganic light-emitting diodes; and a quantum-dot light-emitting diode (QLED) display including QLEDs. Moreover, examples of the display elements to be controlled by voltage include liquid crystal elements.

The embodiments disclosed herewith are examples in all respects, and shall not be cited as grounds for limitative interpretation. Hence, the technical scope of the disclosure shall not be interpreted not by the above embodiments alone but by recitations of claims. All the modifications equivalent to the features of, and within the scope of, the claims are to be included within the scope of the disclosure.

The invention claimed is:

1. A display device displaying an image by supplying corresponding data signals to a plurality of pixel circuits arranged in a display panel, the display device comprising:
   a semiconductor layer; a gate insulating film; a first display wire; a first interlayer insulating film; a second display wire; a second interlayer insulating film; and a third display wire stacked on a substrate in this order,
   the first display wire including a plurality of scanning signal lines extending in a row direction,
   the second display wire including a plurality of constant potential wires extending in the row direction,
   the third display wire including a plurality of data signal lines extending in a column direction and intersecting with the scanning signal lines and the constant potential wires, the column direction intersecting with the row direction,
   the plurality of pixel circuits provided corresponding to intersections of the data signal lines and the scanning signal lines,
   each of the pixel circuits including a first transistor and a second transistor in which any one of the scanning signal lines overlaps the semiconductor layer on top of the gate insulating film,
   one conductive terminal of the first transistor and one conductive terminal of the second transistor being connected together through a connector included in a conductor region of the semiconductor layer, and
   the connector including an overlap connector overlapped in a plan view with the data signal lines through the constant potential wires.

2. The display device according to claim 1, wherein
   the one conductive terminal and another conductive terminal of the first transistor are arranged in the column direction along the data signal lines,
   the one conductive terminal and another conductive terminal of the second transistor are arranged in the column direction along the data signal lines, and
   the overlap connector overlaps with the constant potential wires, and extends in the row direction.

3. The display device according to claim 1, wherein
   any one of the constant potential wires is an initialization wire.

4. The display device according to claim 3, wherein
   the first transistor and the second transistor serve as an initialization transistor.

5. The display device according to claim 4, wherein
   each of the pixel circuits includes a drive transistor,
   another conductive terminal of the first transistor is electrically connected to the initialization wire, and
   another conductive terminal of the second transistor is electrically connected to a control terminal of the drive transistor.

6. The display device according to claim 1, wherein:
   each of the pixel circuits further includes a third transistor in which a branch gate electrode overlaps the semiconductor layer, the branch gate electrode, branching off the scanning signal lines, overlapping the first transistor and the second transistor, and extending.

7. The display device according to claim 6, wherein
   the third transistor includes: one conductive terminal connected to the one conductive terminal of the first transistor through the connector; and another conductive terminal connected to the one conductive terminal of the second transistor through the connector.

8. The display device according to claim 6, wherein the semiconductor layer including the third transistor overlaps the constant potential wires in a plan view.

9. The display device according to claim 6, wherein:
the data signal lines pass between the first transistor and the third transistor in the row direction.

10. The display device according to claim 6, wherein the third display wire further includes a power-source voltage line, and
the power-source voltage line passes between the second transistor and the third transistor in the row direction.

11. The display device according to claim 1, wherein another conductive terminal of the first transistor is connected to any one of conductive terminals of an initialization transistor of a neighboring pixel circuit through the conductor region of the semiconductor layer.

12. The display device according to claim 1, wherein the scanning signal lines include a light-emission control line.

* * * * *